United States Patent
Kelberlau et al.

(10) Patent No.: US 7,442,630 B2
(45) Date of Patent: Oct. 28, 2008

(54) METHOD FOR FABRICATING FORWARD AND REVERSE BLOCKING DEVICES

(75) Inventors: Ulrich Kelberlau, Lampertheim (DE); Peter Ingram, Hemsbach (DE); Nathan Zommer, Los Altos, CA (US)

(73) Assignee: IXYS Corporation, Santa Clara, CA (US)

( * ) Notice: Subject to any disclaimer, the term of this patent is extended or adjusted under 35 U.S.C. 154(b) by 609 days.

(21) Appl. No.: 11/217,134

(22) Filed: Aug. 30, 2005

(65) Prior Publication Data

US 2006/0063313 A1    Mar. 23, 2006

Related U.S. Application Data

(62) Division of application No. 10/099,927, filed on Mar. 13, 2002, now Pat. No. 6,936,908.

(60) Provisional application No. 60/288,896, filed on May 3, 2001.

(51) Int. Cl.
 *H01L 21/04* (2006.01)
(52) U.S. Cl. .................... 438/510; 438/218
(58) Field of Classification Search ............. 438/113, 438/138, 218, 219, 294, 458, 462
 See application file for complete search history.

(56) References Cited

U.S. PATENT DOCUMENTS

| | | | |
|---|---|---|---|
| 3,574,009 A | 4/1971 | Chizinsky et al. |
| 4,042,448 A | 8/1977 | Chang |
| 4,066,483 A | 1/1978 | D'Altroy et al. |
| 4,351,677 A | 9/1982 | Mochizuki et al. |
| 4,450,467 A | 5/1984 | Nagano et al. |
| 4,717,940 A | 1/1988 | Shinohe et al. |
| 4,720,469 A | 1/1988 | Keser et al. |
| 4,914,496 A | 4/1990 | Nakagawa et al. |
| 4,967,255 A | 10/1990 | Bauer et al. |
| 4,994,885 A | 2/1991 | Yoshizawa |
| 5,072,312 A | 12/1991 | Schwarzbauer et al. |

(Continued)

FOREIGN PATENT DOCUMENTS

EP    0 312 088 A2    4/1989

(Continued)

OTHER PUBLICATIONS

Ajit, "1200V High-Side Lateral MOSFET in Junction-Isolated Power IC Technology Using Two Field-Reduction Layer," *IEEE* (1993), pp. 230-235.

(Continued)

*Primary Examiner*—Roy K Potter
(74) *Attorney, Agent, or Firm*—Townsend and Townsend and Crew LLP (57) ABSTRACT

A power device includes a gate electrode, a source electrode, and a drain electrode provided within an active region of a semiconductor substrate of first conductivity type. A vertical diffusion region of second conductivity is provided at a periphery the active region. The vertical diffusion region extends continuously from a top surface of the substrate to a bottom surface of the substrate. The vertical diffusion region includes an upper portion having a first depth and a lower portion having a second depth that is substantially greater than the first depth.

7 Claims, 7 Drawing Sheets

U.S. PATENT DOCUMENTS

| | | |
|---|---|---|
| 5,077,224 A | 12/1991 | Schwarzbauer et al. |
| 5,084,401 A | 1/1992 | Hagino |
| 5,105,244 A | 4/1992 | Bauer |
| 5,119,153 A | 6/1992 | Korman et al. |
| 5,155,569 A | 10/1992 | Terashima |
| 5,164,802 A | 11/1992 | Jones et al. |
| 5,202,750 A | 4/1993 | Gough |
| 5,248,622 A | 9/1993 | Matsuda et al. |
| 5,286,655 A | 2/1994 | Tsunoda |
| 5,298,457 A | 3/1994 | Einthoven et al. |
| 5,360,746 A | 11/1994 | Terashima |
| 5,372,954 A | 12/1994 | Terashima |
| 5,440,164 A | 8/1995 | Finney et al. |
| 5,994,189 A | 11/1999 | Akiyama |
| 6,037,631 A | 3/2000 | Deboy et al. |
| 6,091,086 A | 7/2000 | Zommer |
| 6,376,891 B1 | 4/2002 | Nagatani et al. |
| 6,441,445 B1 | 8/2002 | Leonardi et al. |

FOREIGN PATENT DOCUMENTS

| | | |
|---|---|---|
| EP | 361 316 A2 | 4/1990 |
| EP | 0 521 558 A2 | 1/1993 |
| JP | 53-118367 A | 10/1978 |
| WO | WO 01/18875 A1 | 3/2001 |
| WO | WO 01/36654 | 5/2001 |

OTHER PUBLICATIONS

Temple, "MOS-Controlled Thyristors—A New Class of Power Devices," *IEEE Trans. Elec.* Dev., vol. ED-33, pp. 1609-1618 (1989).

Temple, "Power Device Evolution and the MOS-Controlled Thyristor," *PCIM*, pp. 23-29 (1987).

Wolf et al., "Silicon Processing for the VLSI Era," *Latice Press*, 1:28 (1986).

METHOD FOR FABRICATING FORWARD AND REVERSE BLOCKING DEVICES

CROSS-REFERENCES TO RELATED APPLICATIONS

This application is a divisional application and claims priority to U.S. Non-Provisional patent application Ser. No. 10/099,927, filed on Mar. 13, 2002, which is non-provisional application of U.S. Provisional Patent Application No. 60/288,896, filed May 3, 2001, which are incorporated herein by reference for all purposes.

BACKGROUND OF THE INVENTION

The present invention relates to integrated circuit devices, and in particular high voltage transistors, power MOSFETs, IGBTs, thyristors, MCTs, and the like ("power devices"). Merely by way of example, the present invention is illustrated with an insulated gate bipolar transistor (IGBT) fabrication method and structure.

High voltage transistors such as conventional insulated gate bipolar transistors and the like ("conventional IGBTs"), are fabricated by conventional semiconductor processing techniques on a single crystalline semiconductor substrate, such as a silicon wafer. Conventional semiconductor processing techniques include doping and implanting, lithography, diffusion, chemical vapor deposition (CVD), wet and dry etching, sputtering, epitaxy, and oxidizing. A complex sequence of these processing techniques is often required to produce the conventional IGBT having a high breakdown voltage.

Figure 1:
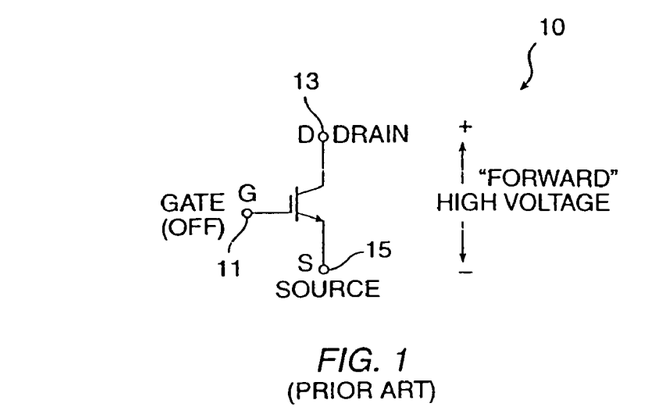
FIGS. 1-2 are circuit diagrams of a conventional IGBT device.

FIG. 1 illustrates a circuit diagram for the conventional IGBT 10. The conventional IGBT includes a gate terminal (G) 11, a drain terminal (D) 13, and a source terminal (S) 15. As shown, a positive voltage potential exists between the drain terminal 13 and the source terminal 15. No switching voltage exists at the gate terminal when the device is in an off-state, and no electrical current passes from the drain terminal 13 to the source terminal 15 in the off-state. The conventional IGBT turns "on" to an on-state when a switching voltage is applied to the gate terminal 11. Current passes from the drain terminal 13 to the source terminal 15 in the on-state.

The conventional IGBT includes a voltage blocking rating only in one direction. In particular, the conventional IGBT provides a "forward blocking" mode to block electrical current therethrough. In the forward blocking mode, the gate is in an off-state, high voltage appears on the drain terminal 13, and low voltage appears on the source terminal 15. Substantially no electrical current flows through the conventional IGBT in the forward blocking mode. It should be noted the forward blocking mode corresponds to the same biasing conditions on the drain terminal and the source terminal as the forward conduction mode, when the device is turned-on.

Figure 2:
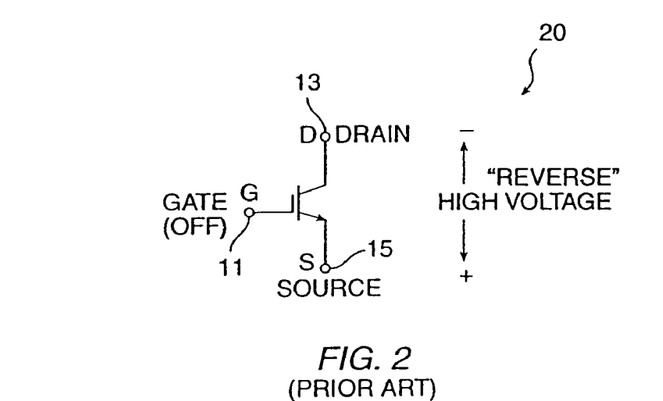

One limitation with the conventional IGBT 20 is that device break down often occurs when relatively low voltage is applied to the device in a reverse blocking mode configuration as illustrated by FIG. 2. In the reverse blocking mode, a positive voltage potential is applied to the source terminal while the gate terminal is in an off-state. The relatively low voltage such as 30-50 volts applied to the source terminal 15, relative to the drain terminal 13, causes uncontrolled conduction of electrical current through the device even though the gate is in the off-state as illustrated by FIG. 3.

Figure 3:
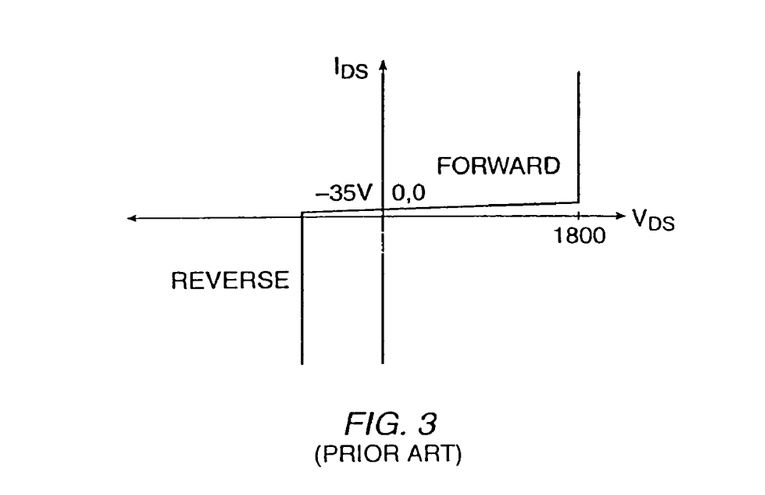
FIG. 3 is an illustration of breakdown voltage for a conventional IGBT device.

FIG. 3 illustrates $I_{DS}$ (a current from drain to source) as a function of $V_{DS}$ (a potential difference from drain to source) for a conventional IGBT device having a breakdown voltage at about 1,800 volts. The conventional IGBT device breaks down causing an uncontrolled conduction of current through the device at about 1,800 volts in the forward blocking mode and at about −35 volts in the reverse blocking mode. Accordingly, the application of conventional IGBTs is generally limited to direct current (DC) configurations operating in the forward conduction mode.

However, it is often desirable to use an IGBT for alternating current (AC) applications, which subject the IGBT to both positive and negative voltage potentials at source and drain terminals. The conventional IGBT, unfortunately, cannot effectively block a high negative voltage potential because of its limited reverse blocking rating.

SUMMARY OF THE INVENTION

According to embodiments of the present invention, a high voltage power device with high ratings for both forward and reverse biasing modes is provided. In one embodiment of the present invention implements a particular scribe diffusion (or isolation diffusion) process that leaves the front side of a substrate sufficiently free of surface damages to facilitate subsequent fabrication steps, e.g., high resolution lithography steps. For example, the scribe diffusion process uses a first impurity type, e.g., boron, on the front side of the substrate and a second impurity type, e.g., aluminum, on the backside of the substrate.

In one embodiment, a power device includes a gate electrode, a source electrode, and a drain electrode provided within an active region of a semiconductor substrate of first conductivity type. A vertical diffusion region of second conductivity is provided at a periphery the active region. The vertical diffusion region extends continuously from a top surface of the substrate to a bottom surface of the substrate. The vertical diffusion region includes an upper portion having a first depth and a lower portion having a second depth that is substantially greater than the first depth. The first depth of the upper portion is less than about 70% of the second depth of the lower portion. The first depth of the upper portion is about 50% of the second depth of the lower portion.

In another embodiment, a method for fabricating a power device includes providing a substrate of first conductivity. The substrate has a front side and a backside. A scribe diffusion region of second conductivity is formed at a periphery of the substrate. The scribe diffusion region extends continuously from the front side to the backside of the substrate. The scribe diffusion region includes an impurity of first type and an impurity of second type that is different than the impurity of first type.

In another embodiment, a method for fabricating a power device includes providing a substrate of first conductivity. The substrate has a front side and a backside. An aluminum structure is formed at a scribe area on the backside of the substrate. The substrate having the aluminum structure is placed in an environment with a first temperature that is less than the melting point of aluminum to prevent the aluminum structure from melting.

DESCRIPTION OF THE SPECIFIC EMBODIMENTS

Figure 4:
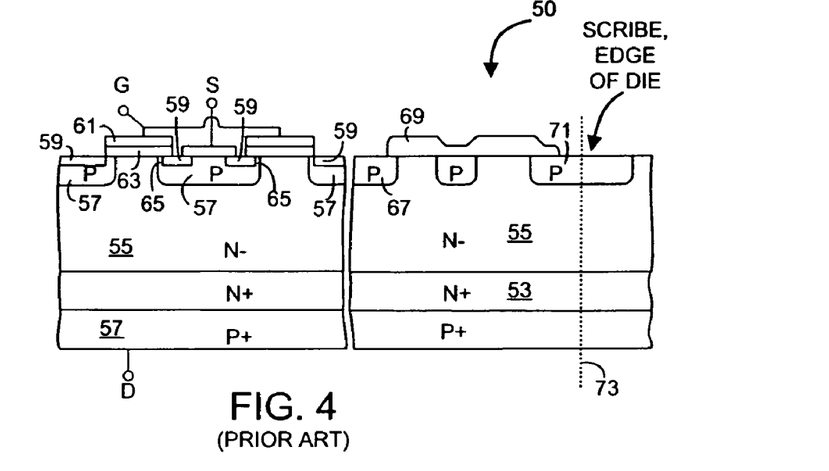
FIG. 4 is a simplified cross-sectional view of a conventional IGBT device.

FIG. 4 is a simplified cross-sectional view 50 of a conventional IGBT integrated circuit device. The conventional IGBT device is often fabricated by a double diffused MOS process (DMOS). The conventional IGBT device 50 includes an N+ type substrate 53, an overlying N− type layer 55, and an underlying P+ type layer 57. P/P+ type well regions 57 are defined in the N− type layer 55. Each P/P+ type well region 57 includes an N type source 59 region defined within its perimeter. A gate polysilicon layer 61 is defined overlying a gate oxide layer 63 overlying a portion of the P/P+ type well region 57. A channel region 65 is defined in a portion of the P type well region between the N type source and a portion of the N− type layer. A gate (G), a source (S), and a drain (D) define the conventional IGBT device structure.

The conventional IGBT device also includes a plurality of P type guard ring regions 67 defined in the N− type layer 55. A field plate 69 typically made of polysilicon is defined overlying the guard ring regions 67. The conventional IGBT device further includes a P type scribe region 71 also defined in the N− type layer 55. The scribe region defines an outer edge of the integrated circuit chip after being removed from the wafer.

The conventional IGBT device of FIG. 4 forms an active region of a typical chip. An active area may comprise hundreds, thousands, or even millions of these microscopically small regions, each defining an active IGBT device. These devices may comprise cells which are all connected in parallel. Alternatively, these regions may comprise stripes or the like defining the active device. These structures of the active device, whether cells or strips, do not typically affect its high voltage characteristics.

Whether the conventional IGBT device, shown in FIG. 4, operates as an IGBT or thyristor depends upon the resistance levels of the layers. For thyristor operation, latch-up is promoted by decreasing the doping in the P/P+ well regions while heavily doping the substrate. This also increases the gain through the device. Conventional IGBT operation, however, requires low resistivity through the N− type layer which does not promote latch-up. Thus, the dopant levels within each layer must be adjusted accordingly to provide IGBT (or thyristor) operation.

The conventional IGBT device provides for off-state voltage blocking to occur predominately in one direction. The conventional IGBT device includes a high forward blocking rating, but a low reverse blocking rating, thereby being limited to DC applications. The low reverse blocking rating occurs by way of the N+/P+ junction 73 which is exposed upon die separation. The exposed N+/P+ junction includes certain doping characteristics which cannot provide for a high breakdown voltage in the reverse conductive mode. For example, high voltage applied to the source terminal relative to the drain terminal creates a main P/P+ type well that is forward biased relative to the N− type layer, creating a diode P/N. The diode P/N is electrically in series with the N+/P+ junction, typically acting like a leaky "zener diode" by way of the unpassivated N+/P+ junction surfaces. The forward biased diode P/N in series with the unpassivated N+/P+ junction cause a low breakdown voltage through the device when the source terminal is high relative to the drain terminal, thereby creating a low reverse blocking rating. The low reverse blocking rating is often incompatible for use with AC applications and the like.

Figure 5A:
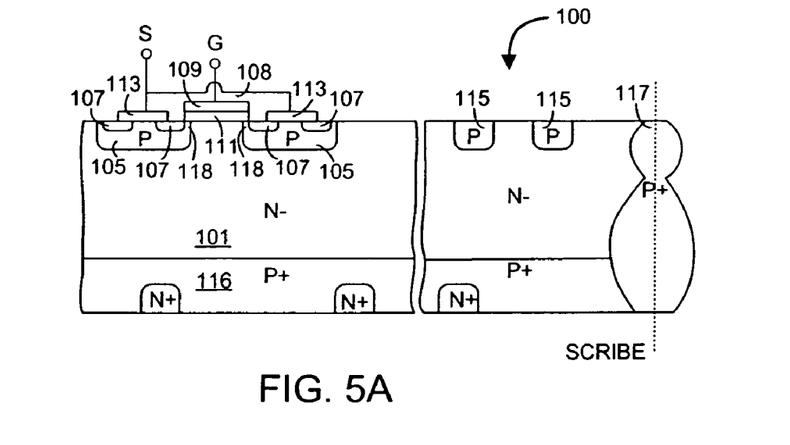
FIG. 5A is a simplified cross-sectional view of an IGBT device according to one embodiment of the present invention.

FIG. 5A is a simplified cross-sectional view of an IGBT integrated circuit device 100 according to one embodiment of the present invention. The present IGBT device may be formed by a double diffused MOS process (DMOS) and the like. Other fabrication techniques may also be used depending upon the particular application. The present IGBT device 100 includes an N type semiconductor substrate 101. In one embodiment, the N type substrate 101 is an N− type layer. P/P+ type well regions 105 are defined onto the N− type layer 101. In the present embodiment, the IGBT device 100 does not include an N+ layer underlying the N− type layer 101 because the N+ layer is thought to reduce reverse and forward blocking ratings in certain implementations.

The IGBT device 100 also includes a plurality of N type source regions 107 defined into a perimeter of each P/P+ type well region 105. The present IGBT device includes a gate polysilicon layer (G) 109 defined overlying a thin layer of gate oxide 111 and the like. Source metallization or electrode 113 is defined overlying the N type source regions 107 and connects each source region together in a common node, as indicated by numeral 108. A P type backside impurity region 116 is defined overlying the backside of the N type substrate. In one embodiment, the backside impurity region is a P+ type drain region. A channel region 118 is defined in a portion of the P/P+ type well region 105 between the source region 107 and a portion of the N− type layer 101.

The IGBT device also includes a plurality of guard ring structures 115. The guard ring structures are P type diffusion regions, typically surrounding the periphery of the active cell region of the integrated circuit chip. A field plate (not shown) made of polysilicon is often defined overlying the guard ring structures. The guard ring structure tends to keep the main conduction region toward the active cell region of the integrated circuit chip, thereby preserving the voltage rating of the device.

A P type peripheral region 117 defines an outer edge of the present IGBT device. The peripheral region 117 may also be referred to as an "isolation diffusion region" or "scribe diffusion region." The scribe diffusion region 117 and the backside impurity region 116 together define a "wrap around" P type envelope (or isolation envelope) covering sides of the die. The scribe diffusion region eliminates the exposed P+/N+ junction of the conventional IGBT device of FIG. 4. Thus, the present IGBT device promotes breakdown to occur at the P+/N junction interface, thereby preserving the high breakdown voltage of the device in both reverse and forward blocking modes.

In one embodiment, the scribe diffusion region 117 is formed by using two different impurity types, e.g., boron as a P type impurity of first type and aluminum as a P type impurity of second type. The front side of the substrate 101 requires a more clean planar surface than the backside of the substrate since fine geometrical structures and multitude of cells are formed on the front side. Although aluminum provides a higher diffusion rate than boron, use of aluminum in a diffusion process to form the scribe diffusion region 117 appears to create damaged surfaces, e.g., etch pits, tiny grooves, and leave residues of aluminum oxides on the surfaces. Such a surface may be unsuitable for high resolution lithography steps that are used to make fine multi-cell structures on the front side (or top surface) of the substrate. The damage to the backside, however, is more tolerable since limited lithography or patterning is performed thereon. Accordingly, a diffusion process to form the scribe diffusion region 117 includes providing boron at a scribe area on the front side of the substrate and aluminum at a scribe area on the backside of the substrate, as explained below in more detail in connection with FIGS. 10-14.

Figure 5B:
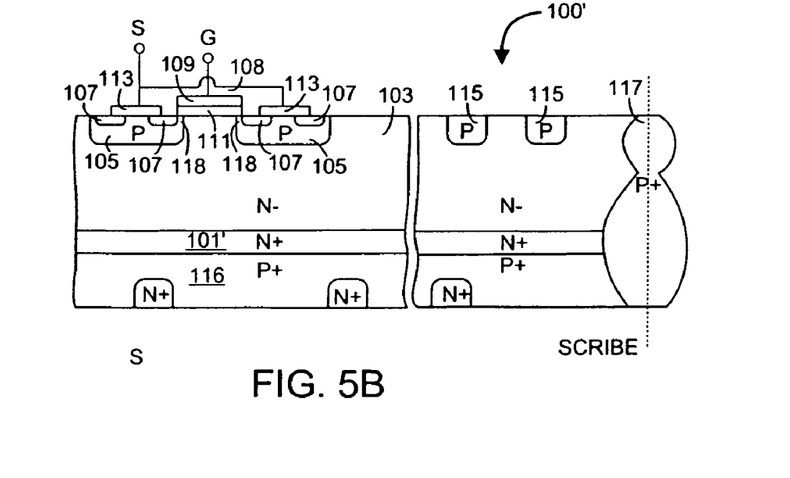
FIG. 5B is a simplified cross-sectional view of an IGBT device according to another embodiment of the present invention.

FIG. 5B is a simplified cross-sectional view of an IGBT integrated circuit device 100' according to another embodiment of the present invention. The IGBT device 100' is substantially identical to the IGBT device 100 in structure. Unlike the IGBT device 100, the present device 100' includes an N+ type semiconductor substrate 101' and an N− type layer 103 formed overlying the N+ type semiconductor substrate. The N− type layer 103 is often an epitaxial layer or the like.

Figure 6:
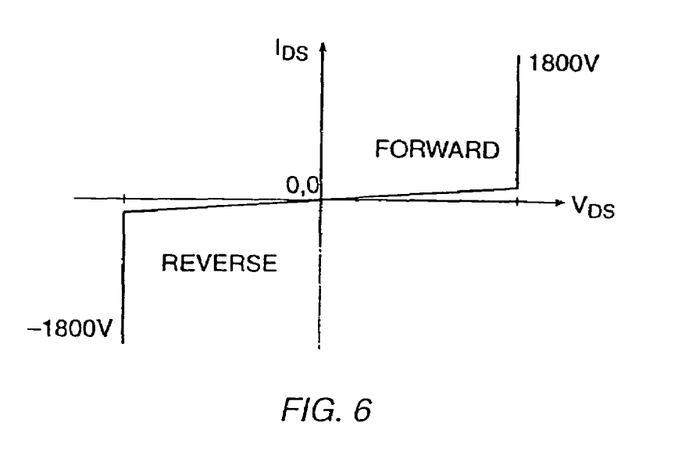
FIG. 6 is a simplified illustration of breakdown voltage for the IGBT device of FIG. 5A according to one embodiment of the present invention.

FIG. 6 is a simplified illustration of breakdown voltage of the IGBT device 100 of FIG. 5A according to one embodiment of the present invention. The present IGBT shows current $I_{DS}$ as a function of voltage $V_{DS}$ for a 1,800 volt device. The present IGBT device passes substantially no electrical current through the device, i.e., remains at an off-state, until the voltage between the source and drain reaches the breakdown voltage of about 1,800 volts and greater or −1,800 volts and less. At the breakdown voltage, the IGBT device passes electrical current via breakdown phenomena. Accordingly, the present IGBT device passes substantially no electrical current therethrough until breakdown occurs or the proper switching voltage is applied to the gate terminal of the device. The IGBT device 100, therefore, includes both high forward and reverse blocking ratings. In one embodiment, the forward and reverse blocking ratings are substantially symmetrical, i.e., substantially of the same magnitude in absolute value.

Figure 7:
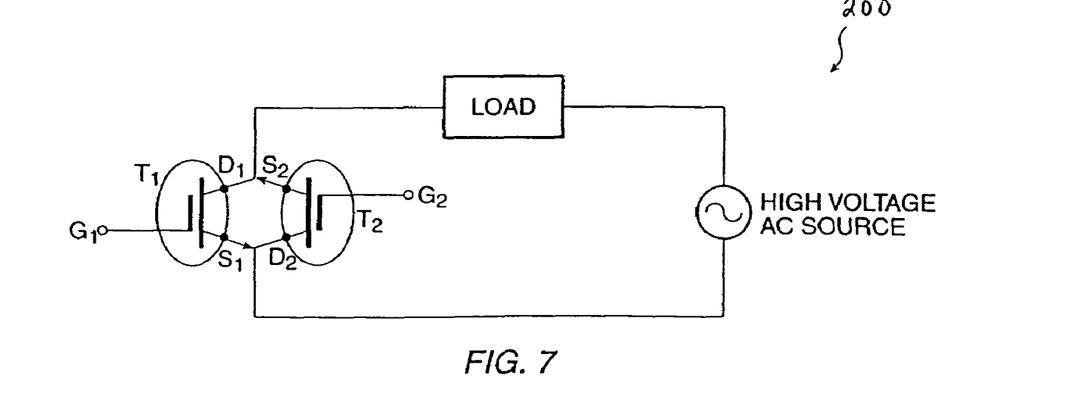
FIG. 7 is a simplified circuit diagram of an IGBT according one embodiment of to the present invention.

FIG. 7 is a simplified circuit diagram 200 of an AC switch according to one embodiment of the present invention. The circuit diagram 200 includes IGBT $T_1$ and IGBT $T_2$. Each IGBT includes a source terminal $S_1$, $S_2$, a gate terminal $G_1$, $G_2$, and a drain terminal $D_1$, $D_2$. The source terminal $S_1$ connects to the drain terminal $D_2$ at a first node, and the source terminal $S_2$ connects to the drain terminal $D_1$ at a second node. The first node connects to an AC power source, and the second node connects to a load. The AC power source also connects to the load to complete the switch loop. AC power is applied to the load by way of selectively providing switching voltages to the transistor gates $G_1$ and $G_2$.

Switching voltages at the gate terminals turn-on each of the IGBT transistors at selected times to allow AC current to pass therethrough. For example, voltage applied to gate $G_2$ passes positive current via positive alternation through transistor $T_2$, and voltage applied to gate $G_1$ passes negative current via negative alternation through transistor $T_1$. By way of the present IGBT structure, each of the IGBT transistors may block voltage in forward and reverse blocking modes for application with the AC power source. The breakdown voltage of each transistor is, for example, 1,800 volts and greater. The breakdown voltage of each transistor may also be 300 volts and greater, 600 volts and greater, or 3,000 volts and greater. The AC power source can provide an AC voltage at about 300 volts and greater, or at about 600 volts and greater, or at about 1,800 volts and greater, or at about 3,000 volts and greater. Of course, the breakdown voltage of each IGBT device and the voltage produced by the AC power supply depend upon a particular application.

Figure 8:
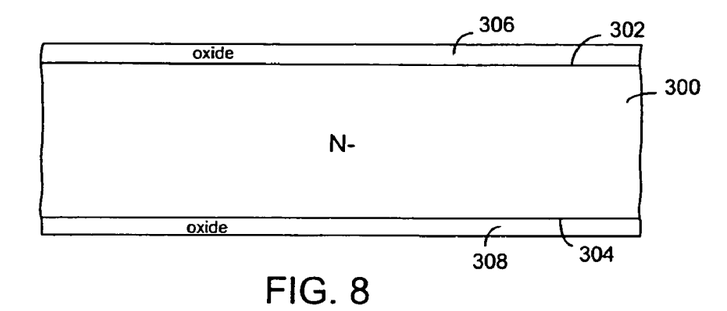
FIGS. 8-17 are fabrication methods of an IGBT according to one embodiment of the present invention.

FIGS. 8-17 illustrate a simplified method of fabricating for a power device, e.g., a forward and reverse blocking IGBT device 360, according to one embodiment of the present invention. A semiconductor substrate 300, e.g., a N− type substrate, having front and back sides 302 and 304, is provided (FIG. 8). Oxides layers 306 and 308 are formed on the front and back sides of the substrate. In one embodiment, the N− type layer includes an N type impurity, such as phosphorous or the like, at a concentration ranging from about $10^{13}$ atoms/cm$^3$ to about $10^{17}$ atoms/cm$^3$, preferably at about $6 \times 10^{13}$ atoms/cm$^3$ for preferred transistor operation to provide blocking voltages up to 1,600 volts. Alternatively, a concentration level of about $4 \times 10^{13}$ atoms/cm$^3$ may be used to provide a blocking voltage that is higher than 1,600 volts. Generally, higher blocking voltages may be obtained for lower concentration levels. Accordingly, other concentration levels may be used depending on the particular application.

A photoresist layers 310 and 312 are formed over the oxides layers 306 and 308, so that the oxide layers are substantially enclosed between the substrate 300 and the photoresist. As used herein, the term "over" or "overlying" refers to a relational position where an object in question is either above or below another object since a first object that appears to be above a second object may appear to be below the second object if the two objects are rotated by 180 degrees.

Figure 9:
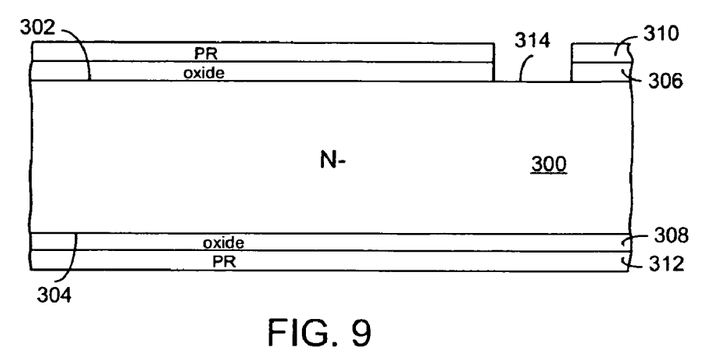

The photoresist layers may be formed from a positive or negative photoresist material depending on the processing needs. A portion of the photoresist layer 310 is selectively exposed to light to pattern (or open) the photoresist layer 310. A portion of the oxide layer 306, underlying the opening of the photoresist layer 310, is exposed. The exposed portion of the oxide layer, in turn, is etched to expose a peripheral or scribe area 314 of the substrate 300 (FIG. 9).

In one embodiment, the above photoresist opening and oxide etch steps are only performed on the front side 302 and not at the backside 304. Therefore, the photoresist layer 312 on the backside of the substrate 300 is left intact, so the oxide layer 308 is substantially covered by the photoresist layer 312.

After exposing the scribe area 314 of the substrate, the photoresist layers 310 and 312 on the front and back sides of the substrate 300 are stripped off the respective oxide layers. The photoresist stripping step may be performed using either a dry ashing or wet etching process. In one embodiment, the stripping step is performed using a wet etch process because this process is believed to leave the surfaces of the oxides and the exposed scribe area 314 in a cleaner state than the dry ashing step.

Figure 10:
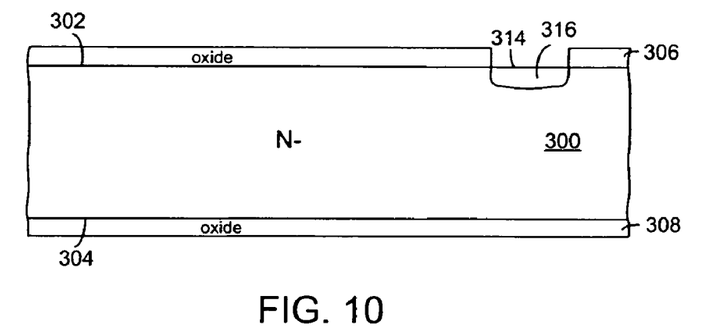

A P type impurity of first type is provided on and within the exposed scribe area 314 of the substrate to form a peripheral impurity region 316 (FIG. 10). In one embodiment, the P type impurity of first type is boron. Boron is used in place of aluminum because it has been discovered that aluminum is more likely to damage the surfaces of the substrate than boron during the scribe diffusion region 117 or the like, as explained previously.

In the present embodiment, boron atoms are provided on the exposed scribe area 314 using a boron compound, e.g., $B_2O_3$. Initially, the compound is spin on a carrier substrate (not shown), and the carrier substrate and the substrate 300 are placed into an oven for a given time. As a result of high temperature within the oven, boron atoms evaporate from the carrier substrate and are deposited onto the scribe area 314 of the substrate 300, which has been left exposed by the oxide layer etch, thereby forming the peripheral impurity region 316. In one embodiment, the boron atoms are deposited onto the scribe area 314 until the saturation level is reach at about $10^{19}$ to $10^{20}$ atoms/cm$^3$. Alternatively, the boron atoms are deposited onto the scribe area 314 until the concentration level is reach at about $10^{16}$ atoms/cm$^2$. The high concentration of boron deposited onto the scribe area 314 is to compensate for boron's lower mobility compared to impurities such as aluminum. Alternatively, boron atoms may be deposited on the scribe area by spinning on the boron compound, e.g., $B_2O_3$, directly onto the substrate 300. Yet in another embodiment, boron atoms are provided on the scribe area 314 by means of ion implantation using energy about of 50-100 keV.

Thereafter, the oxide layer 308 is removed using a wet etch step to expose the backside 304 of the substrate 300. Alternatively, a dry etch step may be used to remove the oxide layer. If a wet etch step is used to remove the oxide layer 308, a photoresist layer is formed over the oxide layer 306 and the scribe area 314 prior to performing the wet etch step to protect these structures while removing the oxide layer 308 in a solvent.

Figure 11:
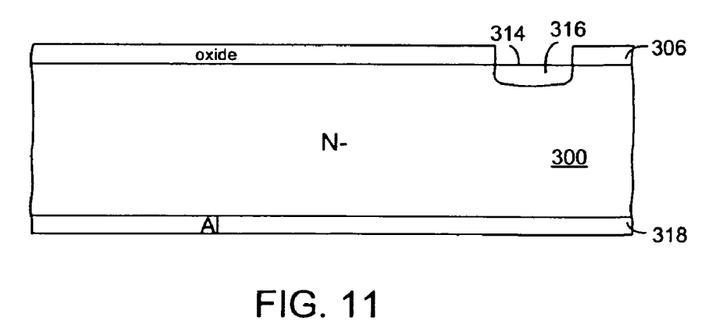

An impurity layer 318 is provided on the exposed backside 304 of the substrate 300 to provide a P type impurity of second type (FIG. 11). In the present embodiment, the P type impurity of second type, e.g., aluminum, has a faster diffusion rate than the P type impurity of first type. Accordingly, the impurity layer of 318 is also referred to as the aluminum layer 318. In other embodiments, other types of impurities may be used including boron.

In the present embodiment, the aluminum layer 318 is deposited onto the backside 304 of the substrate by placing the substrate 300 in a substantially vacuum chamber having an aluminum source. The aluminum source is heated with an electron gun to evaporate the aluminum atoms from the source and have them deposit on the backside 304 of the substrate. In one embodiment, a sputtering method is used to deposit the aluminum layer 318.

Figure 12:
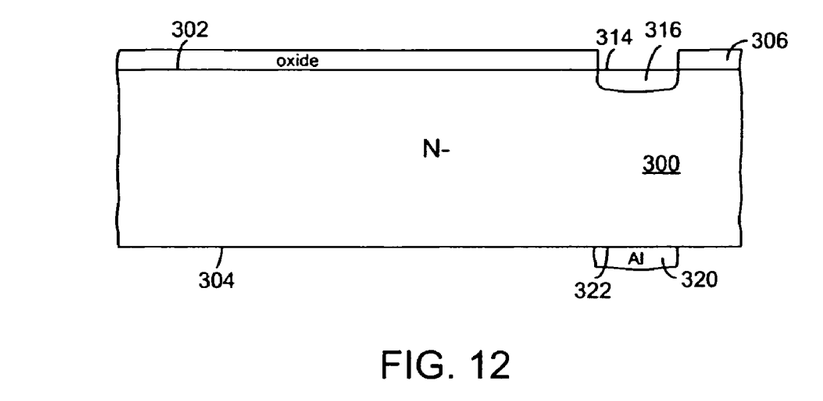

The aluminum layer 318 is patterned to form an aluminum structure 320 at a scribe area 322 on the backside 304 of the substrate 300 (FIG. 12). The scribe area 322 is vertically aligned to the scribe area 314. Patterning of the aluminum layer 318 involves forming a photoresist layer on the aluminum layer 318 and then selectively removing the photoresist layer, except that which directly overlies the scribe area 322. Consequently, a portion of the aluminum layer 318 that directly overlies the scribe area remain covered while other parts of the aluminum layer 318 are exposed. The exposed aluminum layer 318 are etched using a wet etch method. Subsequently, the remaining photoresist layer is removed. The resulting structure is the aluminum structure 320, as shown in FIG. 12.

Figure 13:
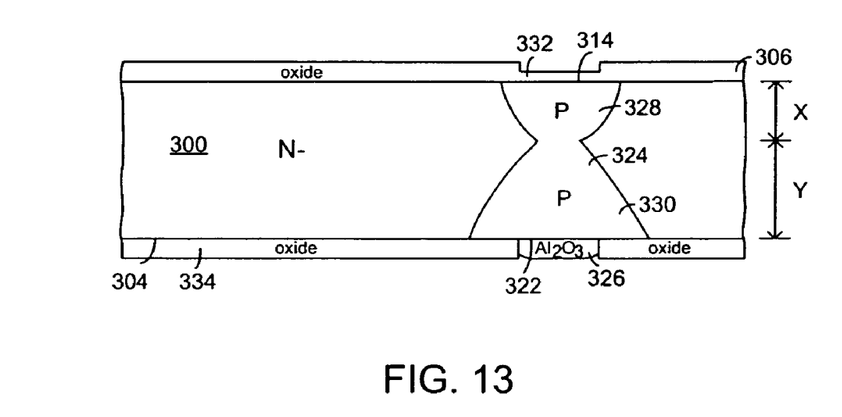

The substrate 300, with the peripheral impurity region 316 and aluminum structure 320, is placed within a furnace to form a scribe diffusion region or isolation diffusion region 324 (FIG. 13). The scribe diffusion region 324 forms a continuous P type "frame" to facilitate elimination of the N+/P+ junction region of the conventional IGBT device, thereby enabling the IGBT device 100 to have both forward and reverse blocking capabilities.

For purposes of forming the scribe diffusion region, the substrate 300 is placed into the furnace, in a nitrogen-oxygen atmosphere, at a temperature of about 500° Celsius. That is, the temperature within the furnace is below the melting point of aluminum, 660.37° Celsius, so that the aluminum structure 320 would not melt and be removed from the scribe region 322 during the scribe diffusion process. The aluminum structure needs to remain on the scribe region 322 to serve as the aluminum source for the diffusion process. Subsequently, the temperature within the furnace is ramped up to above 1000° Celsius, preferably about 1250° Celsius. The substrate 300 is left therein for about 2-3 days or until the boron diffusion region and the aluminum diffusion region merge with each other to form a continuous, vertical frame or region, thereby completing the formation of the scribe diffusion region 324.

The presence of oxygen in the furnace facilitates the diffusion process by converting the aluminum structure 320 into an aluminum oxide structure 326, which has a melting point of 2072° Celsius. This is substantially higher than the highest diffusion process temperature, generally within a range of 1000-1450° Celsius. Accordingly, this aluminum oxide conversion prevents the aluminum structure from melting away from the scribe area 322, thereby providing the scribe area with a secure source of aluminum for the diffusion process. In one embodiment, composition of the nitrogen-oxygen atmosphere is 5-20 percent oxygen gas and 80-95 percent nitrogen gas, preferably about 10 percent oxygen gas and about 90 percent nitrogen gas.

The scribe diffusion region 324 includes an upper portion 328 and a lower portion 330, where the upper portion 328 comprises primarily of a boron diffusion region and the lower portion 330 comprises primarily of an aluminum diffusion region. Aluminum atoms diffuse at a faster rate than boron atoms. Accordingly, the upper portion 328 is smaller in width and depth than the lower portion 330. For example, in a substrate having a thickness of 250 µm, the upper portion 328 has a depth X of about 90 µm and the lower portion 330 has a depth Y of about 180 µm, according to one embodiment of the present invention. In another embodiment, the depth of upper portion is about 70% or less of the depth of the lower portion. Alternatively, the depth of upper portion is about 60% or less of the depth of the lower portion, or even 40% or less of the depth of the lower portion.

As a result of the presence of oxygen in the furnace during the scribe diffusion process, the aluminum oxide structure 326 is formed over the scribe area 322, and an oxide layer 332 is formed over the scribe area 314. In addition, the oxide layer 306 has an increased thickness, and an oxide layer 334 is formed over the backside 304 of the substrate 300 (FIG. 13).

Figure 14:
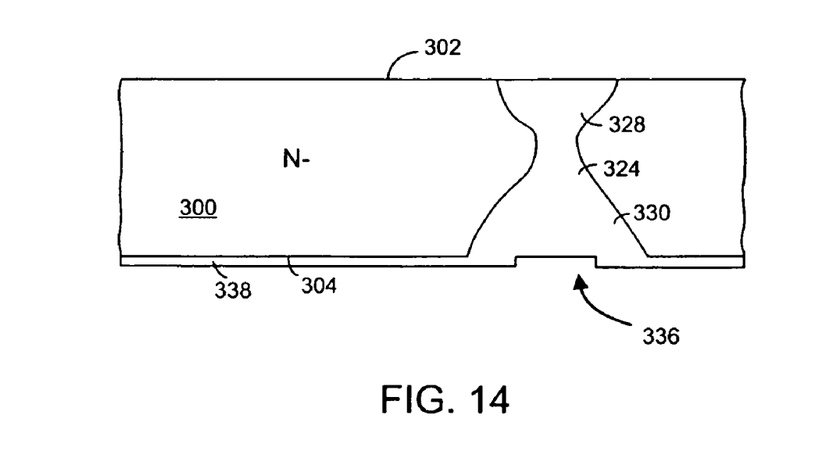

Upon completion of the scribe diffusion process, the aluminum oxide structure 326 is removed using a wet etch step, e.g., inserting the substrate into a KOH solvent, which also removes a portion of the scribe area 322, resulting in formation of a groove 336 (FIG. 14). The oxide layers, e.g., oxide layers 306 an 334, remaining on the substrate 300 are removed using a wet etch step, e.g., inserting the substrate into a HF solvent. An optional cleaning process may be performed by inserting the resulting substrate 300 into a solvent, e.g., HF and $HNO_3$ solvent. Alternatively, a chemical mechanical polishing or dry etch step may be used for the optional cleaning process. In one embodiment, the cleaning process involves removing up to 1 µm of material from the front or back side 302, 304 of the substrate 300, or from both the front and back sides.

Thereafter, a backside impurity region 338 is formed on the backside 304 of the substrate. In one embodiment, boron atoms are implanted into the backside 304 to form the P type impurity region 338. The backside impurity region includes a boron concentration ranging from about $10^{15}$ atoms/cm$^3$ to about $10^{19}$ atoms/cm$^3$, and is preferably at about $10^{18}$ atoms/cm$^3$. A subsequent diffusion step creates the P type drain region which can range in depth from about 50 microns to about 300 microns, and is preferably at about 100 microns for a 600 volt to 3,000 volt IGBT device.

In another embodiment, the depth of the P type drain region may be significantly less, preferably about 6 microns for a 600 volt to 3,000 volt IGBT device. Alternatively, the depth of the P type drain region can be less than 6 microns (e.g., 3, 4, or 5 micron) if boron atoms are implanted into the backside at a later process step, thereby avoiding some of the high temperature processes associated with a double diffused MOS (DMOS) technique.

Figure 15:
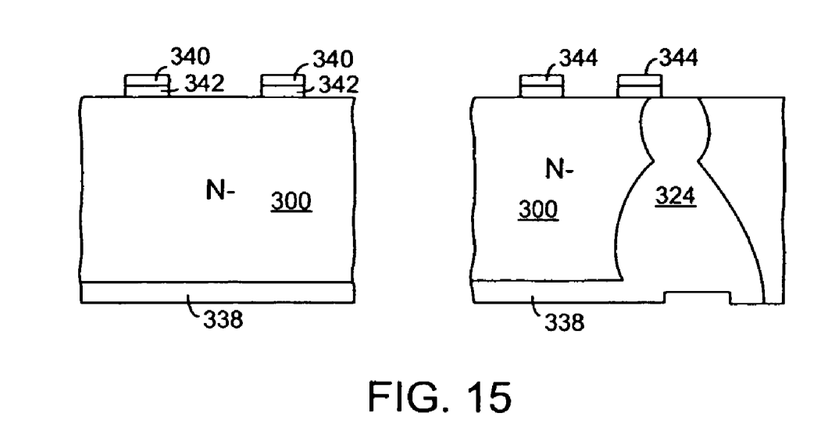

Once the N− substrate 300 having the impurity region 338 and scribe diffusion region 324 are obtained, active IGBT devices are defined onto the N− type substrate 300 by way of, for example, DMOS technique and others, as described in U.S. Pat. No. 4,860,072 to Zommer and U.S. Pat. No. 6,091,086 to Zommer, which are incorporated herein by reference. The DMOS technique defines a gate electrode layer 340 overlying a thin layer of high quality oxide 342 (FIG. 15). The gate electrode layer is typically made of polysilicon and the like, which is preferably doped with an N type dopant material for conductivity. Steps of masking and etching define the gate electrodes (G) overlying the thin high quality oxide formed over the N− type substrate. Also shown are field plate layers 344 formed overlying a portion of the N− type substrate.

Figure 16:
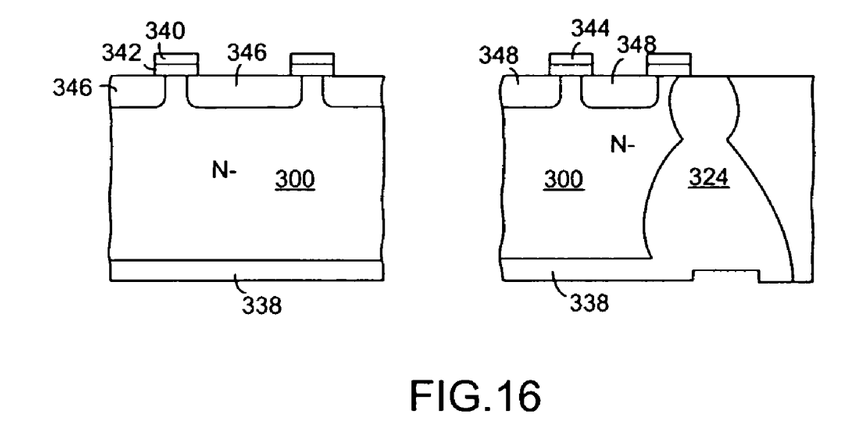

An implant step forms a plurality of P type well regions 346 in the N− type substrate 300, as illustrated by FIG. 16. Each P type well region 346 is preferably a P/P+ type well and is defined between each of the gate electrodes. The P type well region includes a boron impurity concentration ranging from about $10^{14}$ atoms/cm$^3$ to about $10^{18}$ atoms/cm$^3$, and is preferably at about $10^{16}$ atoms/cm$^3$. The implant step also forms one or more P type guard ring regions 348. The P type guard ring regions are defined at an outer periphery of the active cell region to prevent the formation of a conductive region outside of the main junction region. Thus, the P type guard ring regions 348 preserve the high voltage characteristics of the present IGBT device.

Figure 17:
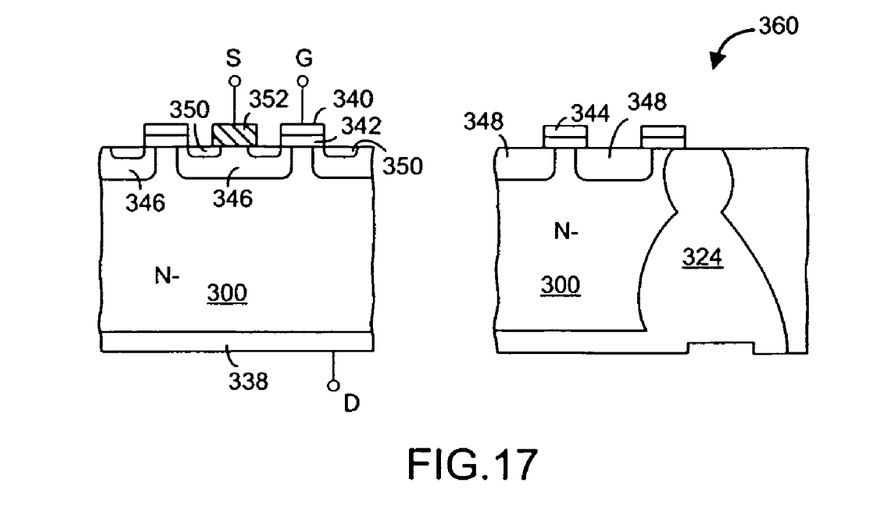

A source implant step forms a plurality of N type source regions (S) 350 within the P type well regions 346 (FIG. 17). The source implant is preferably an arsenic implant where the arsenic is at a concentration ranging from about $10^{17}$ atoms/cm$^3$ to about $10^{20}$ atoms/cm$^3$, and is preferably at about $3\times10^{19}$ atoms/cm$^3$. A source metallization layer or electrode 352, typically aluminum or the like, is formed over the source region 350. As shown, the source (S), the gate (G), and the drain (D) define an IGBT device 360, which is substantially equivalent to the IGBT device 100, according to one embodiment of the present invention.

Figure 18:
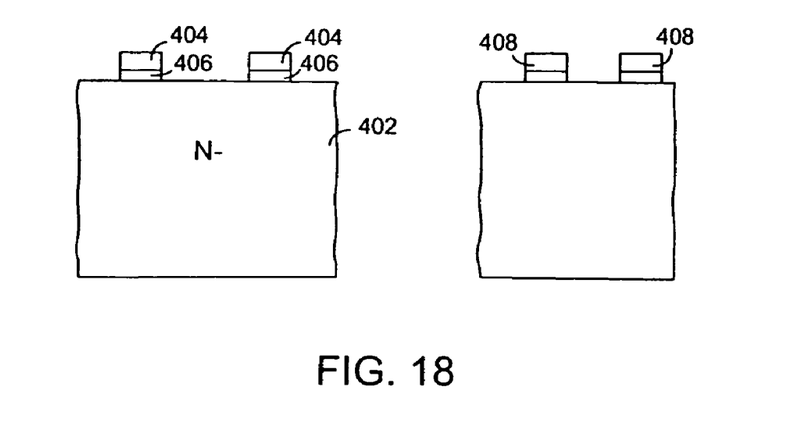
FIGS. 18-20 are fabrication methods of an IGBT according to another embodiment of the present invention.
Figure 19:
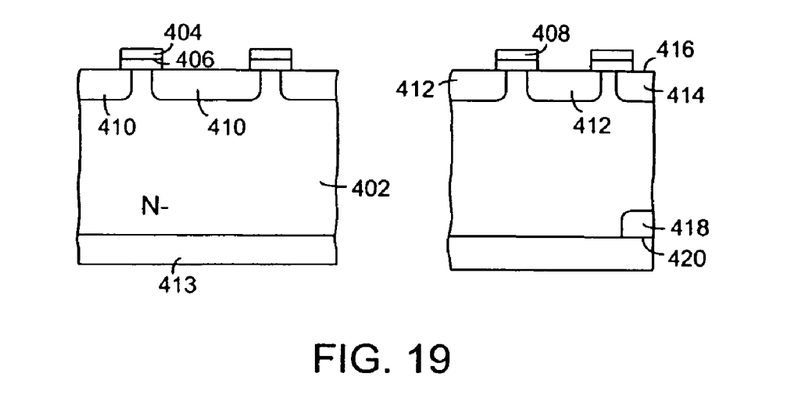
Figure 20:
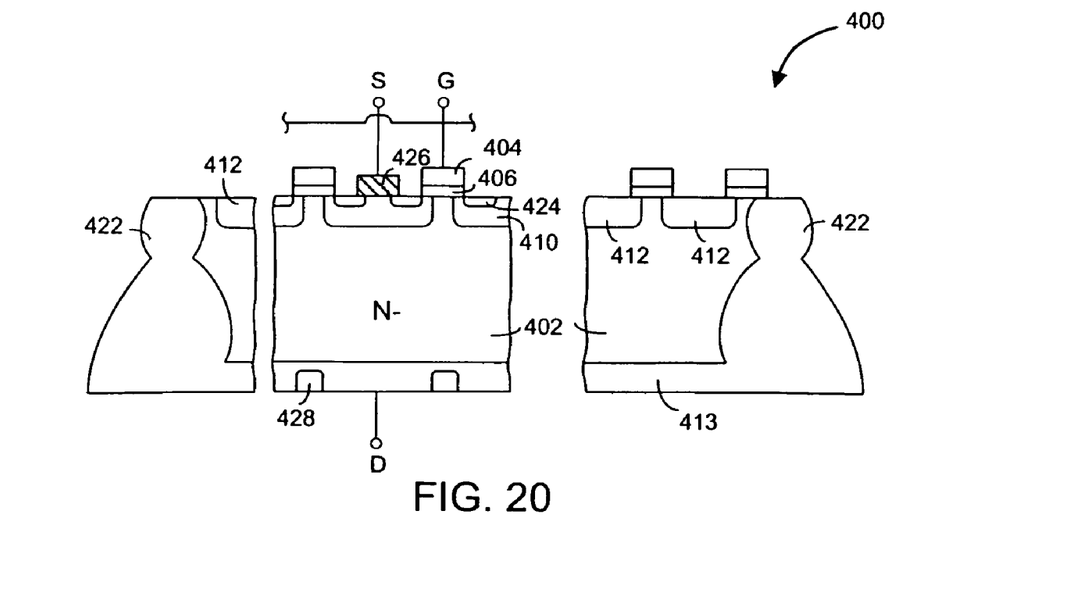

FIGS. 18-20 illustrate a simplified method of fabrication for a high voltage IGBT device 400 according to another embodiment of the present invention. The present fabrication method begins with a semiconductor substrate 400, such as an N− type substrate and the like (FIG. 18.) The N− type substrate includes an N type impurity such as phosphorous or the like at a concentration ranging from about $10^{13}$ atoms/cm$^3$ to about $10^{17}$ atoms/cm$^3$, and is preferably at about $4\times10^{13}$ atoms/cm$^3$ for preferred transistor operation. Of course, other concentrations may also be provided depending upon the particular application.

Active IGBT devices are defined onto the N− type substrate 402 by way of, for example, a double diffused MOS (DMOS) technique and others. The DMOS technique defines a gate electrode layer 404 overlying a thin layer of high quality oxide 406. The gate electrode layer is typically made of polysilicon and the like, which is preferably doped with an N type dopant material for conductivity. Steps of masking and etching define the gate electrodes (G) overlying the thin high quality oxide formed over the N-type substrate. Also shown are field plate layers 408 formed overlying a portion of the N-type substrate.

An implant step forms a plurality of P type well regions 410 in the N− type substrate 300, as illustrated by FIG. 19. Each P type well region 410 is preferably a P/P+ type well and is defined between each of the gate electrodes. The P type well region includes a boron impurity concentration ranging from about $10^{14}$ atoms/cm$^3$ to about $10^{18}$ atoms/cm$^3$, and is preferably at about $10^{16}$ atoms/cm$^3$. The implant step also forms one or more P type guard ring regions 412. The P type guard ring regions are defined at an outer periphery of the active cell region to prevent the formation of a conductive region outside of the main junction region. Thus, the P type guard ring regions 412 preserve the high voltage characteristics of the IGBT device 400.

Thereafter, a backside impurity region 413 is formed on the backside of the substrate. In one embodiment, boron atoms are implanted into the backside to form the P type impurity region 413. The backside impurity region includes a boron concentration ranging from about $10^{15}$ atoms/cm$^3$ to about $10^{19}$ atoms/cm$^3$, and is preferably at about $10^{18}$ atoms/cm$^3$. A subsequent diffusion step creates the P type drain region which is preferably about 6 microns for a 600 volt to 3,000 volt IGBT device. Alternatively, the P type drain region can range in depth from about 3 microns to about 550 microns in other applications.

A P type peripheral impurity region 414 is defined on the front side of the substrate at a scribe area 416 of the integrated circuit chip. A P type peripheral impurity region 418 is also defined on the backside of the substrate at a scribe area 420. Both of the P type impurity regions are defined by way of direct spin-on process, in-direct spin-on process, sputtering, implantation or the like, or a combination thereof.

In one embodiment, the impurity region 414 includes a P type impurity of first type, e.g., boron. The impurity region 418 includes a P type impurity of second type, e.g. aluminum, that has a higher mobility than the impurities provided in the P type well region, the P type guard ring region, and the P type drain region. By way of a subsequent diffusion step(s), the impurities of second type in the P type impurity region 418 diffuse faster than the P type impurities provided in other regions, e.g., the guard ring region, and the drain region. The faster diffusion rate allows the P type impurity regions 414 and 418 to connect to each other to form a scribe diffusion region 422 (FIG. 20). The scribe diffusion region 422 forms a continuous P type "frame" (or isolation diffusion region) around the periphery of the integrated circuit, thereby eliminating the N+/P+ junction region of the conventional IGBT device.

A source implant step forms a plurality of N type source regions (S) 424 within the P type well regions 410 (FIG. 20). The source implant is preferably an arsenic implant where the arsenic is at a concentration ranging from about $10^{17}$ atoms/cm$^3$ to about $10^{20}$ atoms/cm$^3$, and is preferably at about $3\times10^{19}$ atoms/cm$^3$. A source metallization layer or electrode 426, typically aluminum or the like, is formed over the source region 424. As shown, the source (S), the gate (G), and the drain (D) define an IGBT device 400 according to one embodiment of the present invention.

Optionally, a plurality of N+ type regions 428 are formed within the drain region. The N+ type regions are provided with an N+ type dopant, such as phosphorous or the like. The N+ type regions modify the IGBT device performance for special switching and forward voltage drop characteristics. The N+ type regions includes a phosphorous impurity at a concentration ranging from about $10^{16}$ atoms/cm$^3$ to about $10^{19}$ atoms/cm$^3$, and is preferably at about $7\times10^{18}$ atoms/cm$^3$.

In one embodiment, the substrate 402 includes an N+ type substrate or layer (not shown), whereon an N− type layer is provided by way of standard chemical vapor deposition (CVD) techniques, epitaxy, or the like. The N+ type semiconductor substrate includes an N type impurity such as phosphorous or the like at a concentration ranging from about $10^{15}$ atoms/cm$^3$ to about $10^{19}$ atoms/cm$^3$, and is preferably at about $10^{17}$ atoms/cm$^3$. Of course, other concentrations may also be provided depending upon the particular application.

While the above is a full description of the specific embodiments, various modifications, alternative constructions, and equivalents may be used. For example, while the description above is in terms of P type well region, it would be possible to implement the present invention with an N type well region, or the like. Furthermore, while the embodiments shown are generally in terms of an MOSFET, thyristor, and IGBT, it would be possible to implement the improved substrate in the present invention with any device such as, for example, an MCT, or the like. Therefore, the above description and illustrations should not be taken as limiting the scope of the present invention which is defined by the appended claims.

What is claimed is:

1. A method for fabricating a power device, comprising:
   providing a substrate of first conductivity, the substrate having a front side and a backside;
   forming a scribe diffusion region of second conductivity at a periphery of the substrate, the scribe diffusion region extending continuously from the front side to the backside of the substrate, wherein the scribe diffusion region includes an impurity of first type and an impurity of second type that is different than the impurity of first type.

2. The method of claim 1, further comprising:
   providing a peripheral impurity region at a first scribe area on the front side of the substrate, the peripheral impurity region being provided with the impurity of first type; and
   providing the impurity of second type at a second scribe area on the backside of the substrate.

3. The method of claim 1, wherein a concentration of the impurity of first type at the peripheral impurity region is between about $10^{19}$ to $10^{20}$ atoms/cm$^3$.

4. A method for fabricating a power device, comprising:
   providing a substrate of first conductivity, the substrate having a front side and a backside;
   forming an aluminum structure at a scribe area on the backside of the substrate; and
   placing the substrate having the aluminum structure in an environment with a first temperature that is less than the melting point of aluminum to prevent the aluminum structure from melting.

5. The method of claim 4, wherein the environment has oxygen to convert the aluminum structure into an aluminum oxide structure.

6. The method of claim 5, wherein the environment is an inside of a furnace.

7. The method of claim 6, further comprising:
   increasing the temperature of the environment to over 1000 degree Celsius; and
   leaving the substrate within the environment until aluminum atoms have diffused to at least a midpoint between the front and back sides of the substrate.

* * * * *